United States Patent [19]

Bloch et al.

[11] 4,219,926
[45] Sep. 2, 1980

[54] METHOD AND APPARATUS FOR FABRICATING IMPROVED SOLAR CELL MODULES

[76] Inventors: Robert A. Frosch, Administrator of the National Aeronautics and Space Administration with respect to an invention of Joseph T. Bloch; Randolph T. Hanger; Frank W. Nichols, all of Seattle, Wash.

[21] Appl. No.: 14,664

[22] Filed: Feb. 23, 1979

[51] Int. Cl.³ .............................................. H05K 3/34
[52] U.S. Cl. .................................. 29/832; 29/DIG. 1
[58] Field of Search ................... 29/626, DIG. 1, 589; 228/6 A, 175, 180 A; 156/299, 297; 136/206, 89 P, 89 EP

[56] References Cited

U.S. PATENT DOCUMENTS

| | | | |
|---|---|---|---|
| 3,780,424 | 12/1973 | Forestieri et al. | 136/89 EP X |
| 3,849,880 | 11/1974 | Haynos | 136/89 P X |
| 3,874,931 | 4/1975 | Haynos | 136/89 P |
| 3,973,996 | 8/1976 | Kennedy | 29/589 X |
| 4,029,536 | 6/1977 | Kovacs et al. | 156/297 X |
| 4,049,903 | 9/1977 | Kobler | 29/589 X |
| 4,149,665 | 4/1979 | Frosch et al. | 228/6 A X |

FOREIGN PATENT DOCUMENTS 1106419  3/1968  United Kingdom .................... 156/297

Primary Examiner—Francis S. Husar
Assistant Examiner—C. J. Arbes
Attorney, Agent, or Firm—Monte F. Mott; John R. Manning; Wilfred Grifka

[57] ABSTRACT

The invention is embodied in a method and apparatus for fabricating an improved solar cell module. The apparatus includes a supply drum for feeding a flexible strip having deposited thereon etched electrical circuitry, a supply drum for feeding into overlying engagement with the flexible strip a flexible tape having a pair of exposed tacky surfaces, and a plurality of rams for receiving and depositing a plurality of solar cells in side-by-side relation on an exposed tacky surface of the tape in electrical contacting engagement with the etched circuitry.

6 Claims, 4 Drawing Figures

U.S. Patent  Sep. 2, 1980  4,219,926
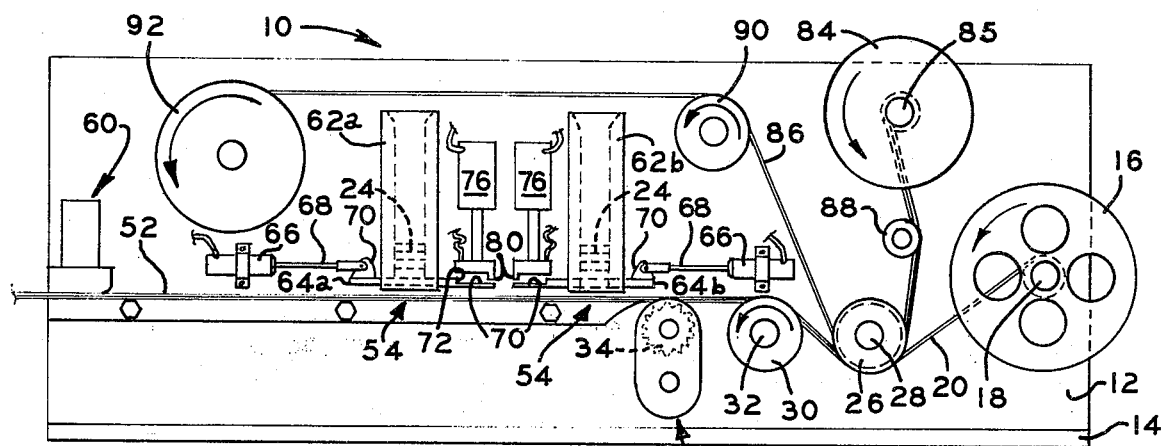
Fig. 1
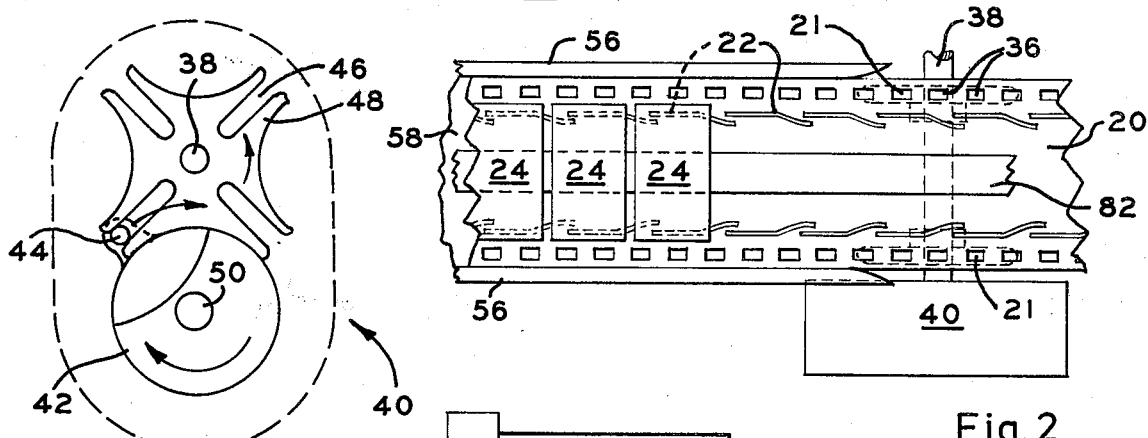
Fig. 3
Fig. 2
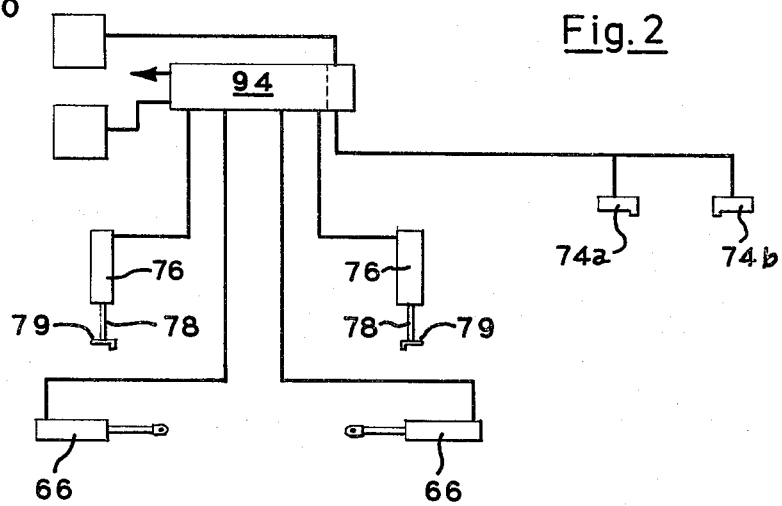
Fig. 4

METHOD AND APPARATUS FOR FABRICATING IMPROVED SOLAR CELL MODULES

ORIGIN OF THE INVENTION

The invention described herein was made in the performance of work under a NASA contract and is subject to the provisions of Section 305 of the National Aeronautics and Space Act of 1958, Public Law 85-568 (72 Stat. 435; 42 USC 2457).

BACKGROUND OF THE INVENTION

1. Field of the Invention

The invention generally relates to automated solar cell module assembly machines and more particularly to a method and apparatus for fabricating improved photovoltaic solar cell modules particularly suited for use aboard operative craft employed in space exploration.

2. Description of the Prior Art

As can be fully appreciated by those familiar with the design and use of photovoltaic solar cell modules, enormous quantities of cells are required in the fabrication of modules to be employed in converting solar energy to electrical energy, in both celestial and terrestrial environments. Heretofore, unique problems have been encountered in the deposition of delicate frangible silicon solar cells on flexible etched circuitry with precise registration. Consequently, manually performed methods have been relied upon in the fabrication of solar cell modules. Of course, techniques requiring a manual installation of solar cells simply are too slow to provide the required quantities at a practical cost. Consequently, economic considerations create a need for high-speed automated methods and apparatus for fabricating such modules, particularly if solar energy is to achieve prominence in reducing dependence on fossil fuels in a terrestrial environment.

It is therefore the general purpose of the instant invention to provide an improved method and apparatus particularly suited for use in fabricating improved solar cell modules.

OBJECTS AND SUMMARY OF THE INVENTION

It is, therefore, an object of the instant invention to provide an improved method for fabricating solar cell modules.

It is another object to provide an improved apparatus for fabricating solar cell modules.

It is another object to provide an improved solar cell module particularly adapted to be fabricated employing an apparatus which performs a method embodying the principles of the instant invention.

Another object is to provide a method and apparatus which is particularly useful in connection with the fabrication of solar cell modules for use in a celestial space environment, although not necessarily restricted in use thereto since the module may be similarly useful in a terrestrial environment.

These together with other objects and advantages are achieved through the use of an apparatus including a supply drum for feeding a flexible strip having deposited thereon etched electrical circuitry, a supply drum for feeding into overlying engagement with the strip a flexible tape having a pair of exposed tacky surfaces, and means including a plurality of pneumatically operated heads supported for displacement into engaging relation with a plurality of solar cells fed from magazines and thereafter depositing the solar cells in side-by-side relation on an exposed tacky surface of the tape in electrical contacting engagement with the circuitry, as will become more readily apparent by reference to the following description and claims in light of the accompanying drawings.

DESCRIPTION OF THE DRAWINGS

FIG. 1 is a schematic view of an apparatus particularly suited for use in performing a method for fabricating a solar cell module embodying the principles of the instant invention.

FIG. 2 is a fragmented plan view of a portion of a solar cell module fabricated employing the apparatus shown in FIG. 1.

FIG. 3 is a schematic view of a Geneva-drive mechanism employed in incrementally advancing the module shown in FIG. 2 through the machine shown in FIG. 1, during fabrication thereof.

FIG. 4 is a schematic view of a pneumatic system suited to be employed by the apparatus shown in FIG. 1.

DESCRIPTION OF THE PREFERRED EMBODIMENT

Referring now to the drawings with more particularity, wherein like reference characters designate like or corresponding parts throughout the several views, there is shown in FIG. 1 an apparatus, generally designated 10, embodying the principles of the instant invention.

For illustrative purposes, it is to be understood that the apparatus 10 is supported by a structural panel 12 disposed in a vertical disposition. The panel is mounted on a supporting plate 14 forming a pedestal fastened or otherwise secured to a horizontal supporting surface such as a work bench, or even the floor or the like for a production facility. It will, of course, be appreciated that the particular manner in which the components of the apparatus, hereinafter to be described, are supported, is a matter of convenience and may be varied as desired.

As shown in FIG. 1, the apparatus 10 includes a supply drum 16 mounted on the panel 12 and supported thereby for rotation by means of a suitable axle 18 connected with the panel. As a practical matter, the axle 18 is interconnected through a friction brake, not shown, with the supply drum 16 in order to preclude over-running of the drum. The drum 16 thus serves as a source of a flexible strip 20 formed of Kelvar, or the like, including sprocket-wheel apertures 21 and having deposited thereon etched electrical circuitry 22, FIG. 2. The purpose of the circuitry 22 simply is to accomodate an electrical interconnection of a plurality of solar cells 24 deposited on the flexible strip 20, subsequent to the strip being fed from the supply drum 16, in a manner which will hereinafter become more readily apparent.

It is, at this juncture, important to note that the flexible strip 20 is trained about a guide roller 26 supported for free rotation by an axle 28, also mounted on the panel 12. Disposed in close proximity with the guide roller 26 is another free-running guide roller 30, mounted on an axle 32, laterally projected from the panel 12 in parallelism with the axle 18. The purpose of the guide roller 30 is to align the strip 20 with a pair of coaxially aligned sprocket wheels 34, disposed in downstream relation with the guide roller 30.

The pair of sprocket wheels 34 are similar in design and construction to sprocket wheels employed in feeding film strips through motion picture projectors and the like. Therefore, it will be appreciated that each of the sprocket-wheels 34 includes a plurality of sprocket-wheel teeth 36 spaced an angular distance such that an alignment of the teeth with the sprocket-wheel apertures 21 is achieved as the flexible strip 20 passes thereover.

In practice, the sprocket-wheels 34 preferably are mounted on a common sprocket-wheel drive shaft 38 adapted to be driven in angular displacement by a Geneva-drive mechanism, generally designated 40. Of course, the particular manner in which the sprocket-wheels 34 are affixed to the sprocket-wheel drive shaft 38 is varied as desired. For example, a coupling pin, not designated, passing through a hub of each of the sprocket-wheels and seated in a bore extended diametrically through the sprocket-wheel drive shaft 38 serves quite satisfactorily for this purpose.

The Geneva-drive 40, as best shown in FIG. 3, is of a simple construction and includes a continuously rotating drive 42 having a peripheral cam 44 positioned to be received within radial slots 46 for a star wheel 48, also pinned to the shaft 38. In practice, the drive 42 is pinned to a drive shaft 50, in turn coupled in driving relation with a suitable motor, not shown, having a rotary output.

Downstream from the pair of sprocket-wheels 34 there is a track 52 extended horizontally through cell deposition stations, generally designated 54. The track 52 includes a pair of guide rails 56 extended in mutual parallelism across planar surface 58 coated with a material characterized by a low coefficient of friction. The purpose of the track 52 is to guide the strip 20 through the cell deposition stations 54 toward a welding station, generally designated 60. It should, at this juncture, be apparent that the sprocket-wheels 34 are located upstream from the cell deposition stations 54. Thus the flexible strip 20 is "pushed" through the cell deposition stations, by the sprocket-wheels 34, rather than being "pulled" through the stations so that the strip 20 may make the required bend around the drive sprockets prior to solar cells being deposited thereon.

Each of the cell deposition stations 54 includes a magazine, designated 62a and 62b, which serve to support solar cells in vertically stacked relation above the track 52. The magazines 62a and 62b comprise bottom-feed magazines having defined therein horizontally oriented, coaxially aligned slots not designated, through which extend a pair of shuttle plates, designated 64a and 64b. Each of the shuttle plates 64a and 64b is connected with a pneumatic actuator, designated 66, through a linear actuator rod 68. As a practical matter, each of the actuator rods 68 comprises a piston shaft projected from a piston head seated within one of the pneumatic actuators 66.

Where so desired, the pneumatic actuator 66 comprises a spring loaded, single-acting pneumatic ram which serves to impart reciprocation to the actuator rod 68 in response to a pneumatic pulse being applied thereto. Since the pneumatic actuators 66 are of a well known design, a detailed discussion of the actuators is omitted in the interest of brevity. However, it is to be understood that pneumatic pulses applied to the pneumatic actuators 66 serve to drive the shuttle plates 64a and 64b in reciprocation for effecting a feeding of solar cells from the magazines 62a and 62b in a proper timed sequence.

Each of the shuttle plates 64a and 64b is provided with a relieved surface comprising a carrier 70, the purpose of which is to receive and transport one cell at a time from an adjacently disposed magazine. Consequently, each of the carriers also includes a vertically oriented shoulder 72 the purpose of which is to engage a vertical face for a cell received by the carrier 70. Hence, each cell received by one of the carriers is advanced horizontally in response to horizontal motion imparted to the shuttle plate for the carrier.

Interposed between the magazines 62a and 62b there in a pair of pneumatic cell pick-up heads, designated 74a and 74b, supported for vertical reciprocation by a pair of pneumatic actuators 76. Each pneumatic actuator 76 includes a vertically oriented actuator rod 78 having connected to the distal end thereof brackets 79 for mounting the pick-up heads 74a and 74b. For the sake of convenience, the cell pick-up heads 74a and 74b are diagramatically illustrated in FIG. 4 in separated relation with the mounting brackets 79 provided therefor. However, it is to be understood that each of the pick-up heads 74a and 74b is attached to and supported by one of the brackets 79 whereby the head is transported by an actuator 76.

Since the pneumatic actuators 76 are similar in design and operation to the pneumatic actuators 66, aforedescribed, a detailed description of the actuators 76 is omitted in the interest of brevity. However, it should be appreciated that each of the actuators 76 is caused to extend the actuator rod 78 associated therewith in response to an applied pneumatic pulse, for downwardly displacing a bracket 79 and the pneumatic pick-up head mounted thereon. At the termination of the applied pulse the actuator rod 78 is retracted for lifting and thus retracting the bracket and its associated pick-up head. Consequently, a cycle of operation for each of the actuators 76 is initiated in response to an applied pneumatic pulse and during each such cycle of operation the pneumatic pick-up connected to the bracket 79, at the distal end of the rod 78, is lowered and then raised along a linear path.

It also is important to note that each of the pick-up heads 74a and 74b includes a depending protuberance comprising a stop 80, the purpose of which is to engage and position solar cells 24 sequentially delivered from one of the magazines 62a and 62b adjacently related thereto. In operation, the shuttle plates 62a and 62b simultaneously transport along horizontal paths solar cells from the magazines 62a and 62b into positions immediately beneath the pick-up heads 74a and 74b. The stops 80 serve to arrest the lateral motion of the cells and finally position each of the cells preparatory to its being pneumatically attached to one of the pick-up heads. In practice, pneumatic attachment of the cells is achieved in response to a vacuum applied to the heads. Subsequent to solar cells 24 being attached to the pick-up heads 74a and 74b, the shuttle plates 64a and 64b simultaneously are retracted for thus permitting the actuators 76 to extend the actuator rods 78 for causing the solar cells 24 to be downwardly displaced and positioned against the upper surface of the flexible strip 20. It is to be understood that where so desired the extension of the rods may be effected in downwardly stepped progression, without departing from the invention. However, for the sake of simplicity in description, it is assumed that rods 78 are sequentially extended and retracted for causing the heads 74a and 74b to engage, lift and then lower the cells 24 into forced engagement with the strip 20. Upon the cells 24 being forced into engaged relation with the flexible strip 20, the vacuum is removed from the pick-up heads 74a and 74b, simultaneously, with the pneumatic pulse also being removed from the actuators 76. Consequently, the pick-up heads 74a and 74b immediately are elevated leaving the pair of cells 24 deposited on the upper surface of the flexible strip 20.

It is particularly important to note that extended along the upper surface of the strip 20 there is a double-backed tape 82 the purpose of which is to capture the cells 24. It also is important to note that, in practice, the strip 82 is fed from a supply drum 84 into overlying mated relationship with the upper surface of the flexible strip 20, just prior to passage of the strip 20 about the periphery of the guide roller 26, whereby the strips 20 and 82 are caused to become adhesively united at their surfaces.

While the tape 82 is fabricated from any suitable material, as currently employed the tape comprises a Polyken 125 double-backed tape having opposed tacky surfaces. In practice, the tape 82 is fed from the supply drum 84 with its outer backing strip, designated 86, still in place. The backing strip 86 engages an idler roll 88, the purpose of which simply is to align the tape 82 as it progresses toward the guide roller 26. As shown in the drawings, the backing strip 86 is lifted and directed away from the flexible strip 20 as it exits the periphery of the roller 26 and is trained over another idler roll 90, before finally being taken up by a suitably driven take-up drum 92 disposed in laterally spaced relation with the roll 90.

The tape 82 is, of course, applied to the upper surface in a suitable position for receiving the cells 24 so that cells deposited on the flexible strip 20, become adhesively secured to the upper surface of the flexible strip 20 without interrupting electrical continuity of the circuitry 22. Hence, the position of the tape relative to the strip 20 is varied as desired.

The tape 82 further serves as electrical insulation interposed between portions of the backs of the cells and the electrical circuitry 22. Of course, where so desired, the tape 82 is provided with slots, perforations and the like in order to assure establishment of an electrical contact between the cells 24 and the circuitry.

While various control circuits and the like may be employed in controlling the operation of the apparatus 10, as currently employed, a control bank 94 comprising a set of cam operated valves synchronized with the Geneva-drive 40, is employed with variable sized orifices being included in the control lines thereof in order to control response times of the pneumatic actuators. Since the details of cam operated valves form no part of the claimed invention and such devices are well known in the art, a detailed description of the valves of the bank 94 is omitted in the interest of brevity.

In operation it is highly desirable that the cells 24 be electrically connected to the electrical circuitry 22. Such is achieved at a welding station, designated 60, employing a laser welding apparatus, not shown. For example, successful welds have been made employing a ruby laser at 0.7 micron wave length and 80 joules Q switched over 0.5 milliseconds. Specimens thus produced are characterized by a pull strength of up to 120 grams for welds and 600 grams for solders.

Since the particular mechanism employed in connecting the cells to the circuitry form no part of the claimed invention, and is varied as desired, a detailed description of the station 60 is omitted in the interest of brevity. It suffices to understand that the cells 24 are secured in a selected disposition relative to the circuitry 22 deposited on the strip 20, established prior to the cells passing from the stations 54, and that an ultimate interconnection of the cells 24 with the circuitry 22 is effected in any suitable manner, as by welding or the like, the details of which form no part of the claimed invention.

OPERATION

It is believed that in view of the foregoing description, the operation of the invention herein disclosed is apparent. However, in the interest of completeness the operation of the disclosed invention will, at this point, briefly be reviewed.

With the apparatus 10 assembled in the manner hereinbefore described, a flexible Kapton strip 20 having an etched electrical circuitry 22 deposited thereon is wound about the supply drum 16 and prepared for feeding. Such preparation is achieved simply by unwinding a leading end portion of the strip and training that portion of the strip about the guide rollers 26 and 30, and thence about the sprocket-wheels 34 and finally passing the end portion of the strip through the cell deposition station 54 to the station 60. Of course, a supply of solar cells 24 are stacked, face-up, in the magazines 62a and 62b in a position to be fed in response to a lateral reciprocation therethrough of the shuttle plates 64a and 64b.

Additionally, a supply of double-back tape 82 is wound about a supply drum 84 and mounted on the spindle 85, with an end portion of the tape being unwound from the supply drum, passed about the periphery of the idler roll 88 and thence about the center portion of the periphery of the guide roller 26. The end portion of the backing strip 86 is removed from the tape 82 and trained about the idler roll 90 and attached to the take-up drum, when driven in synchronization with the sprocket-wheels 34, causing the backing strip to be wound about the periphery of the take-up drum 92.

The apparatus 10, thus prepared for operation, is actuated simply by energizing the motors employed in driving the drive shaft 50, as well as the take-up drum 92 and energizing the control bank 94. As the drive shaft 50 is driven in rotation, the Geneva-drive 40 responsively imparts stepped advancement to the strip 20 for causing the tape to advance incrementally through the cell deposition stations 54.

At appropriate instances in time, the actuators 66 are simultaneously activated by the control bank 94 for forcing the shuttle plates 64a and 64b to pass through the magazines 62a and 62b in order to remove therefrom the lowermost solar cells 24 for causing the cells to be transported into engaged relation with the stops 80. The actuators 76 next are activated for causing the heads 74a and 74b to be depressed and engage the upper surfaces of the cells 24 supported by the carriers 70 of the shuttle plates 64a and 64b. A vacuum is applied to the heads 74a and 74b for thus causing the cells to become adhered to the heads. Preferably, the heads are lifted in response to a retraction of the rods 78 and of the actuator rods 68. The actuators 76 are again extended forcing the cells 24 downwardly into engaged relation with the upper surface of the flexible strip 20, the electrical circuitry 22, and the upper surface of the tape 82.

Once the cells have been deposited on the upper surface of the strip 20, the vacuum is removed and the pick-up heads 74a and 74b are returned to their initial elevated positions. The sprocket-wheel drive shaft 50 is again advanced in stepped rotation, in response to the operation of the Geneva-drive 40, for causing the flexible strip 20 to be indexed to a new position for receiving another pair of solar cells 24 applied in the manner hereinbefore described. Of course, as the strip 20 is advanced, the backing 86 simultaneously is removed from the tape 82 and wound about the take-up drum 92. Upon leaving the cell deposition station 54 the cells 24 are caused to pass through the station 60 at which a laser welding, or similar operation, is performed for securing the cells 24 to the circuitry 22 in order to establish electrical continuity therebetween.

In view of the foregoing, it should readily be apparent that the apparatus embodying the principles of the instant invention provides a practical solution to many of the problems previously encountered in economically fabricating solar cell modules.

What is claimed is:

1. In a method for fabricating a solar cell module, the steps comprising:
    A. advancing a flexible strip having deposited on one face thereof electrical circuitry for electrically interconnecting solar cells;
    B. depositing on said strip in overlying relation with said face a flexible strip of double-backed tape; and
    C. depositing on said face in engaged relation with said tape and said circuitry a plurality of similarly oriented solar cells arranged in side-by-side alignment.

2. In a method as defined in claim 1 wherein the flexible strip is advanced in incremental motion and the solar cells are deposited during dwells in the advancing motion.

3. In a method as defined in claim 1 wherein the strip of double-backed tape is fed from a roll and incrementally advanced in synchronism with said strip.

4. In a method as defined in claim 1 the further step comprising connecting said solar cells to the electrical circuitry.

5. In a method for fabricating a solar cell module the steps comprising:
    A. intermittently feeding from a supply roll an elongated flexible strip having deposited on one face thereof etched electrical circuitry and advancing said strip with stepped, incremental motion;
    B. incrementally advancing from a supply roll in timed relation with the film strip an elongated flexible strip of double-backed tape having opposed tacky surfaces and applying the tape to said one face of the flexible film strip;
    C. depositing on said strip in contacting relation to a tacky surface of said tape a plurality of solar cells; and
    D. connecting said cells to said electrical circuitry.

6. In a method as defined in claim 5 wherein the step of depositing said cells on said strip includes the step of extracting the cells from a supply magazine and forcing the cells into engaged relation with said tape and said circuitry during dwells between the steps of the incremental motion of the strip.

* * * * *